United States Patent
Harada et al.

(10) Patent No.: US 10,023,499 B2
(45) Date of Patent: Jul. 17, 2018

(54) HARD MATERIAL, SINTERED MATERIAL, TOOL INCLUDING SINTERED MATERIAL, MANUFACTURING METHOD OF HARD MATERIAL, AND MANUFACTURING METHOD OF SINTERED MATERIAL

(71) Applicant: Sumitomo Electric Industries, Ltd., Osaka-shi (JP)

(72) Inventors: Takashi Harada, Itami (JP); Akito Ishii, Itami (JP); Satoru Kukino, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/502,434

(22) PCT Filed: Aug. 4, 2015

(86) PCT No.: PCT/JP2015/072050
§ 371 (c)(1),
(2) Date: Feb. 7, 2017

(87) PCT Pub. No.: WO2016/021581
PCT Pub. Date: Feb. 11, 2016

(65) Prior Publication Data
US 2017/0217838 A1 Aug. 3, 2017

(30) Foreign Application Priority Data
Aug. 8, 2014 (JP) .................................. 2014-162793

(51) Int. Cl.
*C04B 35/581* (2006.01)
*C04B 35/584* (2006.01)
(Continued)

(52) U.S. Cl.
CPC ........ *C04B 35/5831* (2013.01); *B23B 27/148* (2013.01); *C04B 35/581* (2013.01);
(Continued)

(58) Field of Classification Search
CPC ...... C04B 35/581; C23C 16/303; C23C 16/34
See application file for complete search history.

(56) References Cited

U.S. PATENT DOCUMENTS 5,948,716 A 9/1999 Kume et al.
6,824,601 B2 * 11/2004 Yamamoto .......... C23C 14/0641
106/286.2
(Continued)

FOREIGN PATENT DOCUMENTS

JP H04-300248 A 10/1992
JP H10-182234 A 7/1998
(Continued)

OTHER PUBLICATIONS

Vollstädt et al., "High Pressure Synthesis of Rocksalt Type of AlN," Proc. Japan Acad., 66, Ser. B (1990), pp. 7-9.
(Continued)

*Primary Examiner* — Karl E Group
(74) *Attorney, Agent, or Firm* — Venable LLP; Michael A. Sartori; Kerri M. Patterson

(57) ABSTRACT

A hard material which, when used as a material of a sintered material, makes it possible to obtain a sintered material with excellent abrasion resistance, a sintered material, a cutting tool including the sintered material, a method for manufacturing the hard material and a method for manufacturing the sintered material are provided. The hard material contains aluminum, nitrogen, and at least one element selected from the group consisting of titanium, chromium, and silicon, and has a cubic rock salt structure.

9 Claims, 1 Drawing Sheet

(51) Int. Cl.
C23C 14/14 (2006.01)
C23C 14/24 (2006.01)
C04B 35/5831 (2006.01)
B23B 27/14 (2006.01)
C04B 35/58 (2006.01)
C04B 35/622 (2006.01)
C04B 35/64 (2006.01)

(52) U.S. Cl.
CPC ...... *C04B 35/584* (2013.01); *C04B 35/58007* (2013.01); *C04B 35/58014* (2013.01); *C04B 35/62222* (2013.01); *C04B 35/64* (2013.01); *C23C 14/14* (2013.01); *C23C 14/24* (2013.01); *B23B 2228/08* (2013.01); *B23B 2228/24* (2013.01); *C04B 2235/386* (2013.01); *C04B 2235/3852* (2013.01); *C04B 2235/3865* (2013.01); *C04B 2235/3873* (2013.01); *C04B 2235/3886* (2013.01); *C04B 2235/604* (2013.01); *C04B 2235/762* (2013.01)

(56) References Cited

U.S. PATENT DOCUMENTS

| 8,257,841 | B2* | 9/2012 | Endler | C23C 16/029 |
| | | | | 427/255.23 |
| 2007/0160872 | A1 | 7/2007 | Iwata | |
| 2008/0131727 | A1* | 6/2008 | Derflinger | C23C 14/027 |
| | | | | 428/634 |
| 2011/0081539 | A1* | 4/2011 | Ni | C23C 14/0641 |
| | | | | 428/328 |
| 2013/0149527 | A1* | 6/2013 | Cho | C23C 16/34 |
| | | | | 428/336 |

FOREIGN PATENT DOCUMENTS

| JP | 2001085624 A | * | 3/2001 | |
| JP | 2001-089242 A | | 4/2001 | |
| JP | 2002-160129 A | | 6/2002 | |
| JP | 2004-284851 A | | 10/2004 | |
| JP | 2012161909 A | * | 8/2012 | ......... C23C 14/0641 |
| JP | 2013-216517 A | | 10/2013 | |
| JP | 2014-105131 A | | 6/2014 | |

OTHER PUBLICATIONS

Alling et al., "Pressure enhancement of the isostructural cubic decomposition in $Ti_{1-x}Al_xN$," Applied Physics Letters, vol. 95 No. 18, 2009, pp. 181906-1-181906-3.

International Search Report in counterpart International Application No. PCT/JP2015/072050, dated Oct. 27, 2015.

Shi et al., "Effect of Cu addition on properties of Ti—Al—Si—N nanocomposite films deposited by cathodic vacuum arc ion plating," Surface & Coatings Technology, 206 (2012): pp. 2947-2953. [Cited in OA issued in counterpart EP application dated Feb. 5, 2018].

Li et al., "Hard nanocomposite Ti—Cu—N. films prepared by d.c. reactive magnetron co-sputtering," Surface and Coatings Technology, 183 (2001): pp. 62-68. [Cited in OA issued in counterpart EP application dated Feb. 5, 2018].

* cited by examiner

HARD MATERIAL, SINTERED MATERIAL, TOOL INCLUDING SINTERED MATERIAL, MANUFACTURING METHOD OF HARD MATERIAL, AND MANUFACTURING METHOD OF SINTERED MATERIAL

TECHNICAL FIELD

The present invention relates to a hard material, a sintered material, a tool including a sintered material, a method for manufacturing a hard material, and a method for manufacturing a sintered material.

BACKGROUND ART

As a material for a cutting tool for use in a cutting work or the like, an aluminum oxide ($Al_2O_3$) sintered material is known. An aluminum oxide sintered material is excellent in that it has high hardness owing to very strong bonding strength between oxygen and aluminum, has low reactivity with an iron-based work material, and can be manufactured at low cost.

On the other hand, an aluminum oxide sintered material tends to have low toughness. This would be ascribable to the fact that the crystal structure of aluminum oxide is hexagonal, and has strong anisotropy, and the aluminum oxide sintered material is susceptible to transgranular fracture along the weak bonding direction such as a direction perpendicular to the c axis. Therefore, the aluminum oxide sintered material tends to be easily broken when it is used as a cutting tool.

Further, aluminum oxide has low reactivity with metal compounds such as nitrides and carbonitrides of metals in Group 4, Group 5, and Group 6 of the periodic table which serve as a binding material. Therefore, when a sintered material is produced by using aluminum oxide and these metal compounds, the obtained sintered material tends to be susceptible to chipping due to a defect or dropout of crystal grains.

Japanese Patent Laying-Open No. 2001-89242 (PTD 1) discloses, as a ceramic sintered member having high hardness, strength, and toughness in regions from the low temperature region to the high temperature region, and having high thermal shock resistance and thermal crack resistance, a ceramic sintered member made from aluminum nitride in place of aluminum oxide, and further containing a titanium compound.

Japanese Patent Laying-Open No. 4-300248 (PTD 2) discloses, as a ceramic sintered material suppressed in chipping due to a defect or dropout of crystal grains, a sintered material formed by sintering a mixed powder of 40 to 80% by volume of titanium nitride (TiN) and aluminum nitride (AlN) as a main component of a binder.

Aluminum nitride includes hexagonal aluminum nitride having a hexagonal crystal structure, and cubic aluminum nitride having a cubic crystal structure. Based on comparison of hardness between hexagonal aluminum nitride and cubic aluminum nitride, it is conceivable that cubic aluminum nitride having higher hardness is preferred as a material for a cutting tool. However, at normal temperature and normal pressure, hexagonal aluminum nitride is stable, and cubic aluminum nitride is metastable. Therefore, it is impossible to obtain cubic aluminum nitride at normal temperature and normal pressure.

Japanese Patent Laying-Open No. 2004-284851 (PTD 3) discloses a method of spraying a powder of hexagonal aluminum nitride and a carrier gas in an aerosol form to a substrate in a deposition chamber under reduced pressure, to change the crystal structure of hexagonal aluminum nitride to cubic aluminum nitride by the impact at the time of collision to the substrate.

"Proceedings of the Japan Academy", 1990, Series B, Vol. 66, pp. 7-9 (Non PTD 1) discloses obtaining a powder containing cubic aluminum nitride and hexagonal aluminum nitride by treating hexagonal aluminum nitride under an ultra-high pressure and a temperature of 16.5 GPa and 1400 to 1600° C.

Also as a material for a cutting tool for use in a cutting work or the like, high speed steel (hereinafter, also referred to as HSS) is also used.

Japanese Patent Laying-Open No. 2002-16029 (PTD 4) discloses a method for coating HSS with an AlCrN hard film having excellent heat resistance and abrasion resistance.

CITATION LIST

Patent Document

PTD 1: Japanese Patent Laying-Open No. 2001-089242
PTD 2: Japanese Patent Laying-Open No. 4-300248
PTD 3: Japanese Patent Laying-Open No. 2004-284851
PTD 4: Japanese Patent Laying-Open No. 2002-160129

Non Patent Document

NPD 1: "Proceedings of the Japan Academy", 1990, Series B, Vol. 66, pp. 7-9

SUMMARY OF INVENTION

Technical Problems

The technique of Japanese Patent Laying-Open No. 2004-284851 (PTD 3) has a problem that only cubic aluminum nitride in the form of powder or thin film can be obtained, and a sintered material mainly containing cubic aluminum nitride cannot be obtained.

The technique of "Proceedings of the Japan Academy", 1990, Series B, Vol. 66, pp. 7-9 (NPD 1) has a problem that a powder containing metastable cubic aluminum nitride with high purity cannot be obtained, as hexagonal aluminum nitride remains in the powder obtained by the technique.

The technique of Japanese Patent Laying-Open No. 2002-16029 (PTD 4) has a problem that abrasion of a tool advances rapidly and the service life is shortened if the coating film of the tool is lost by abrasion or a defect because the AlCrN hard film is thin.

Thus, it is an object of the present invention to provide a hard material capable of providing a sintered material having excellent abrasion resistance when used as a material for a sintered material, a sintered material, a cutting tool including a sintered material, a method for manufacturing a hard material, and a method for manufacturing a sintered material.

Solutions to Problems

A hard material according to one aspect of the present invention is a hard material containing aluminum, nitrogen, and at least one selected from the group consisting of titanium, chromium, and silicon, and having a cubic rock salt structure.

A sintered material according to one aspect of the present invention is a sintered material containing the aforementioned hard material.

A tool according to one aspect of the present invention is a cutting tool including the aforementioned sintered material.

A method for manufacturing a hard material according to one aspect of the present invention is a method for manufacturing the aforementioned hard material, and includes the steps of: preparing a target containing aluminum, and at least one selected from the group consisting of titanium, chromium, and silicon as constituent elements; and treating the target in an argon and nitrogen atmosphere by a physical vapor deposition method to gas-phase synthesize a thin film containing the hard material on a substrate.

A method for manufacturing a hard material according to one aspect of the present invention is a method for manufacturing the aforementioned hard material, and includes the steps of: preparing a first grain group containing at least either of aluminum grains and aluminum nitride grains, and at least one selected from the group consisting of chromium grains, titanium grains, silicon grains and grains of nitrides of these elements; and treating the first grain group by a static pressure synthetic method or a shock compression method to produce the hard material.

A method for manufacturing a sintered material according to one aspect of the present invention is a method for manufacturing the aforementioned sintered material, and includes the steps of: preparing a hard material by the aforementioned method for manufacturing a hard material; preparing a second grain group containing the hard material; and sintering the second grain group to produce a sintered material.

Advantageous Effects of Invention

According to the aforementioned aspects, it becomes possible to provide a hard material capable of providing a sintered material having excellent abrasion resistance when used as a material for a sintered material, a sintered material, a cutting tool including a sintered material, a method for manufacturing a hard material, and a method for manufacturing a sintered material.

DESCRIPTION OF EMBODIMENTS

Figure 1:
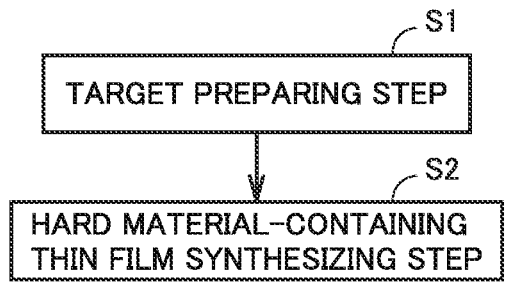
FIG. 1 is a flowchart illustrating a method for manufacturing a hard material according to one aspect of the present invention.

[Description of Embodiments of the Present Invention]

First, embodiments of the present invention are enumerated and described.

A hard material according to one aspect of the present invention is (1) a hard material containing aluminum, nitrogen, and at least one selected from the group consisting of titanium, chromium, and silicon, and having a cubic rock salt structure.

Since the hard material has a cubic rock salt structure, it is possible to obtain a sintered material having excellent abrasion resistance when the hard material is used as a material for a sintered material.

(2) Preferably, the hard material contains greater than or equal to 0.1% by mass and less than or equal to 3.0% by mass of copper. When the hard material is used as a material for a sintered material, it is possible to further improve the abrasion resistance of the sintered material.

(3) Preferably, the hard material contains a total of greater than or equal to 0.5% by mass and less than or equal to 5.0% by mass of a first metal containing at least one selected from the group consisting of iron, cobalt and nickel. When the hard material is used as a material for a sintered material, it is possible to further improve the abrasion resistance of the sintered material.

(4) A sintered material according to one aspect of the present invention is a sintered material containing the hard material according to any one of (1) to (3).

Since the sintered material contains a hard material having a cubic rock salt structure, it is excellent in abrasion resistance.

(5) Preferably, the sintered material further contains at least one compound formed of at least one transition metal element selected from the group consisting of elements in Group 4, elements in Group 5, and elements in Group 6 of the periodic table, and either one or both of carbon and nitrogen. This configuration further improves the abrasion resistance of the sintered material.

(6) Preferably, the sintered material further contains greater than or equal to 10% by mass and less than or equal to 70% by mass of cubic boron nitride. This configuration further improves the abrasion resistance of the sintered material.

(7) A tool according to one aspect of the present invention is a cutting tool including the sintered material according to any one of (4) to (6).

Since the sintered material is excellent in abrasion resistance, the tool including the sintered material is also excellent in abrasion resistance. Therefore, the tool according to one aspect of the present invention has a longer service life than before.

(8) A method for manufacturing a hard material according to one aspect of the present invention is a method for manufacturing the hard material according to any one of (1) to (3), and includes the steps of: preparing a target containing aluminum, and at least one selected from the group consisting of titanium, chromium, and silicon as constituent elements; and treating the target in an argon and nitrogen atmosphere by a physical vapor deposition method to gas-phase synthesize a thin film containing the hard material on a substrate.

(9) A method for manufacturing a hard material according to one aspect of the present invention is a method for manufacturing the hard material according to any one of (1) to (3), and includes the steps of: preparing a first grain group containing at least either of aluminum grains and aluminum nitride grains, and at least one selected from the group consisting of chromium grains, titanium grains, silicon grains and grains of nitrides of these elements; and treating the first grain group by a static pressure synthetic method or a shock compression method to produce the hard material.

According to the method for manufacturing a hard material according to (8) or (9), it is possible to obtain a hard material having a cubic rock salt structure.

(10) A method for manufacturing a sintered material according to one aspect of the present invention is a method for manufacturing the sintered material according to any one of (4) to (6), and includes the steps of: preparing a hard material by the manufacturing method according to (8) or (9); preparing a second grain group containing the hard material; and sintering the second grain group to produce a sintered material.

According to this manufacturing method, it is possible to obtain a sintered material containing a hard material having a cubic rock salt structure.

[Detail of Embodiments of the Present Invention]

Concrete examples of a hard material, a sintered material, a tool, a method for manufacturing a hard material, and a method for manufacturing a sintered material according to embodiments of the present invention will be described below. It is intended that the present invention is not limited to these illustrations, but specified by claims, and any modifications within the meaning and the range equivalent to claims are included in the present invention.

The term "metal" as used herein is not limited to a simple metal formed of one metal element such as "Fe" but includes alloys formed of two or more metal elements such as "FeNi" unless otherwise specified.

The term "compound" as used herein represents a compound formed of one or more metal elements and one or more nonmetal elements. As the nonmetal element, carbon and nitrogen can be recited.

When an atomic ratio is not particularly specified in a chemical formula described herein, the atomic ratio among the elements is not necessarily an equal ratio, but includes any conventionally known atomic ratio.

The term "average grain size" as used herein means a value measured by a grain size distribution measuring machine such as a Microtrac.

<First Embodiment>

The hard material according to the first embodiment contains aluminum, nitrogen, and at least one selected from the group consisting of titanium, chromium, and silicon, and has a cubic rock salt structure.

The cubic rock salt crystal structure is a crystal structure typified by rock salt (sodium chloride), and is a structure in which two different kinds of face-centered cubic lattices are combined with each other with being deviated from each other by a half of the edge length in the direction of the edge of the unit cubic lattice. The hard material according to the first embodiment has higher hardness than hexagonal aluminum nitride does because it has such a structure that at least one selected from the group consisting of titanium, chromium, and silicon is dissolved in a crystal structure of aluminum nitride having a cubic rock salt crystal structure (hereinafter, also referred to as cubic AlN or cAlN). Therefore, when the hard material is used as a material for a sintered material, it is possible to obtain a sintered material having excellent abrasion resistance.

In the present description, a solid solution formed of AlN, and at least one selected from the group consisting of titanium, chromium, and silicon is also referred to as AlMN (M is at least one selected from the group consisting of titanium, chromium, and silicon). The AlMN having a cubic rock salt crystal structure is also referred to as cubic AlMN or cAlMN (M is at least one selected from the group consisting of titanium, chromium, and silicon).

The hard material is preferably represented by the general formula $Al_xM_{(1-x)}N_y$ ($0<x<1$, $0.7 \leq y \leq 1$). In general, cubic AlMN is likely to change to hexagonal AlMN that is stable at normal temperature when the amount of nitrogen is insufficient. When the nitrogen amount y in AlMN falls within the range of $0.7 \leq y \leq 1$, AlMN is capable of keeping the cubic crystal structure stably. More preferably, y falls within the range of $0.9 \leq y \leq 1$.

The hard material may contain unintended inevitable impurities.

The hard material according to the first embodiment preferably contains greater than or equal to 0.1% by mass and less than or equal to 3.0% by mass of copper, and more preferably contains greater than or equal to 0.1% by mass and less than or equal to 0.5% by mass of copper. When the hard material is used as a material for a sintered material, it is possible to further improve the abrasion resistance of the sintered material.

While the reason for the aforementioned matter is not clear, it is surmised as follows. When the hard material contains copper, copper exists on the grain boundary of AlMN, and suppresses the grain growth of AlMN. Thus, the hardness of the hard material is increased, and the abrasion resistance of the sintered material containing the hard material is increased.

On the other hand, since the melting point of copper is lower than those of aluminum nitride, titanium, chromium, and silicon, the hardness of the hard material at high temperature would decrease as the content of copper in the hard material increases. Therefore, in a sintered material containing a hard material having a large content of copper, the abrasion resistance at high temperature can be decreased. From this point of view, the content of copper in the hard material is preferably less than or equal to 3.0% by mass.

The hard material according to the first embodiment preferably contains a total of greater than or equal to 0.5% by mass and less than or equal to 5.0% by mass, and more preferably in a total of greater than or equal to 0.5% by mass and less than or equal to 1.0% by mass of the first metal containing at least one selected from the group consisting of iron, cobalt and nickel. When the hard material is used as a material for a sintered material, it is possible to further improve the abrasion resistance of the sintered material.

Regarding the reason for the aforementioned matter, it is surmised as follows. When at least one selected from the group consisting of iron, cobalt and nickel is dissolved in AlMN, an internal distortion occurs in AlMN due to difference in atomic radius between constituting atoms and dissolved atoms or the like, and motion of dislocation is hindered. This would result in solid solution strengthening of AlMN, increase in hardness of the hard material, and improvement in abrasion resistance of the sintered material containing the hard material.

On the other hand, when the amount of iron, cobalt and nickel in the hard material increases, and exceeds the solubility limit of the solid solution, a precipitate is formed in the hard material, and this would cause decrease in hardness of the hard material. Therefore, in the sintered material containing a hard material having a large solid solution amount of iron, cobalt and nickel, the abrasion resistance can decrease. From this point of view, the content of the first metal in the hard material is preferably less than or equal to 5.0% by mass.

As the first metal, for example, metals formed of one metal such as iron, cobalt, or nickel, and alloys containing these metals can be recited. The first metal may be used alone or in combination of two or more kinds.

<Second Embodiment>

The sintered material according to the second embodiment is a sintered material containing the hard material according to the first embodiment. Since the sintered material contains a hard material having a cubic rock salt structure, it is excellent in abrasion resistance.

Preferably, the sintered material further contains at least one compound formed of at least one transition metal element selected from the group consisting of elements in Group 4, elements in Group 5, and elements in Group 6 of the periodic table, and either one or both of carbon and nitrogen. The elements in Group 4 of the periodic table include titanium (Ti), zirconium (Zr) and hafnium (Hf), the elements in Group 5 include vanadium (V), niobium (Nb) and tantalum (Ta), and the elements in Group 6 include chromium (Cr), molybdenum (Mo) and tungsten (W).

The compound in the sintered material exists on the boundary between neighboring grains of the hard material, and functions as a binder phase. Since the binder phase is capable of binding the grains of the hard material strongly, the sintered material is capable of having more excellent abrasion resistance.

Further, when the sintered material contains the binder phase, the sintered material is capable of having characteristics attributable to the binder phase in addition to the characteristics attributable to the characteristics of the hard material. Therefore, by appropriately adjusting the composition of the binder phase, the sintered material can flexibly respond to various needs required for various cutting conditions.

Preferably, the sintered material contains greater than or equal to 30% by mass and less than or equal to 70% by mass of the compound.

As the compound, for example, carbides, nitrides, or carbonitrides of at least one transition metal element selected from the group consisting of elements in Group 4, elements in Group 5, and elements in Group 6 can be used.

Examples of the carbides of a transition metal element that can be used include titanium carbide (TiC), zirconium carbide (ZrC), hafnium carbide (HfC), vanadium carbide (VC), niobium carbide (NbC), tantalum carbide (TaC), chromium carbide ($Cr_3C_2$), molybdenum carbide ($Mo_2C$), and tungsten carbide (WC).

Examples of the nitrides of a transition metal element that can be used include titanium nitride (TiN), zirconium nitride (ZrN), hafnium nitride (HfN), vanadium nitride (VN), niobium nitride (NbN), tantalum nitride (TaN), chromium nitride ($Cr_2N$), molybdenum nitride (MoN), and tungsten nitride (WN).

Examples of the carbonitrides of a transition metal element that can be used include titanium carbonitride (TiCN), zirconium carbonitride (ZrCN), and hafnium carbonitride (HfCN).

The compound may be used solely, or in combination of two or more kinds.

Preferably, the sintered material further contains greater than or equal to 10% by mass and less than or equal to 70% by mass of cubic boron nitride, and more preferably the sintered material further contains greater than or equal to 30% by mass and less than or equal to 50% by mass of cubic boron nitride.

Since cubic boron nitride has very high hardness, when the sintered material contains cubic boron nitride, the hardness of the sintered material increases, and the abrasion resistance of the sintered material improves.

<Third Embodiment>

The tool according to the third embodiment is a tool including the sintered material according to the second embodiment. Since the sintered material is excellent in abrasion resistance, the tool including the sintered material is also excellent in abrasion resistance.

Examples of the cutting tool according to the third embodiment include drills, end mills, indexable cutting tips for milling, indexable cutting tips for turning, metal saws, gear cutting tools, reamers, and taps. The cutting tool may be entirely formed of the aforementioned sintered material, or partly formed of the sintered material (for example, the edge part may be formed of the sintered material).

When the cutting tool is entirely formed of the aforementioned sintered material, the cutting tool can be produced by working the sintered material into a desired form. Working of the sintered material can be conducted, for example, by laser or wire discharge. When the cutting tool is partly formed of the aforementioned sintered material, the cutting tool can be produced by joining the sintered material to a desired position of the base constituting the tool. While the method of joining the sintered material is not particularly limited, it is preferred to provide a joining layer for binding the base to the sintered material strongly between the base and the sintered material from the view point of preventing the sintered material from coming off the base.

<Fourth Embodiment>

The method for manufacturing a hard material according to the fourth embodiment will be described with reference to FIG. 1.

The method for manufacturing the hard material having a cubic rock salt structure described in the first embodiment includes: the step of preparing a target containing aluminum, and at least one selected from the group consisting of titanium, chromium, and silicon as constituent elements (indicated by S1 in FIG. 1, hereinafter, also referred to as "target preparing step"); and the step of treating the target in an argon and nitrogen atmosphere by a physical vapor deposition method to gas-phase synthesize a thin film containing the hard material on a substrate (indicated by S2 in FIG. 1, hereinafter, also referred to as "hard material-containing thin film synthesizing step").

(Target Preparing Step)

Referring to FIG. 1, in the target preparing step (S1), a target containing aluminum, and at least one selected from the group consisting of titanium, chromium, and silicon as constituent elements is prepared. Specifically, a target is prepared, for example, by mixing grains of aluminum, titanium, chromium, silicon and so on.

The target is a material for a hard material. Among aluminum, nitrogen, titanium, chromium, and silicon that compose the hard material, aluminum, titanium, chromium, and silicon are supplied exclusively from the target. Therefore, it is necessary to make the content rates of aluminum, titanium, chromium, and silicon in the target the same as the content rates of aluminum, titanium, chromium, and silicon in the intended hard material. On the other hand, nitrogen in the hard material is supplied mainly from the atmosphere (nitrogen atmosphere). Therefore, the content rate of nitrogen in the target is not necessarily required to be the same as the content rate of nitrogen in the intended hard material.

When the ratio among number of aluminum atoms "a", number of titanium atoms "b", number of chromium atoms "c", and number of silicon atoms "d" in the target is represented by a:b:c:d (wherein a+b+c+d=1), "a" is preferably greater than or equal to 0.2 and less than or equal to 0.7, and more preferably greater than or equal to 0.5 and less than or equal to 0.7. When a falls within these ranges, it is possible to produce a hard material having high hardness. "b" is preferably greater than or equal to 0.2 and less than or equal to 0.7, and more preferably greater than or equal to 0.3 and less than or equal to 0.5. "c" is preferably greater than or equal to 0.2 and less than or equal to 0.7, and more preferably greater than or equal to 0.3 and less than or equal to 0.5. "d" is preferably greater than or equal to 0.1 and less than or equal to 0.5, and more preferably greater than or equal to 0.1 and less than or equal to 0.2.

The target can further contain copper. The content of copper in the target is preferably adjusted so that the content of copper in the hard material to be produced is greater than or equal to 0.1% by mass and less than or equal to 3.0% by mass, and more preferably greater than or equal to 0.1% by mass and less than or equal to 0.5% by mass.

The target can further contain a first metal containing at least one selected from the group consisting of iron, cobalt and nickel. The total content of the first metal in the target is preferably adjusted so that the total content of the first metal in the hard material to be produced is greater than or equal to 0.5% by mass and less than or equal to 5.0% by mass, and more preferably greater than or equal to 0.5% by mass and less than or equal to 1.0% by mass.

Copper and the first metal exert the effects of strengthening the hard material by the effects estimated as impartment of the residual stress caused by a difference in thermal expansion coefficient, Young's modulus difference, or solid solution in the subsequent hard material-containing thin film synthesizing step. Therefore, when the target contains copper or the first metal, it is possible to produce a hard material having high hardness.

(Hard Material-containing Thin Film Synthesizing Step)

Next, in the hard material-containing thin film synthesizing step (S2), the target is treated by arc ion plating or a direct-current sputtering technique to form a thin film containing a hard material (cAlMN) on the substrate. Preferably, Ar and $N_2$ are used as the process gas. It is preferred to adjust the arc current in the range from 10 A to 300 A, the bias voltage in the range from 10 V to 500 V, and the $N_2$ gas pressure in the range from 0.1 Pa to 30 Pa. As the substrate, a thin plate of high speed steel is preferably used. For controlling the grain size or crystallinity of AlMN, it is preferred to synthesize the thin film under heating to 100° C. to 500° C. By conducting the treatment in a nitrogen atmosphere and plasma, atomic diffusion and nitriding of Al and M (M is at least one selected from the group consisting of titanium, chromium, and silicon) are conducted.

By treating the target at the aforementioned pressure, bias voltage and temperature, it is possible to obtain cubic AlMN represented by the general formula $Al_xM_{(1-x)}N_y$ ($0<x<1$, $0.7 \leq y \leq 1$).

The thin film containing the hard material synthesized on the substrate is preferably ground to have an average grain size of greater than or equal to 0.1 μm and less than or equal to 10 μm with a ball mill device or a bead mill device after being removed from the substrate. The obtained hard material grains can be used as a material for a sintered material.

<Fifth Embodiment>

A method for manufacturing a hard material according to the fifth embodiment will be described with reference to FIG. 2.

Figure 2:
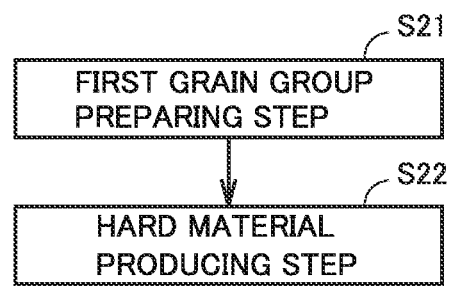
FIG. 2 is a flowchart illustrating a method for manufacturing a hard material according to one aspect of the present invention.

The method for manufacturing the hard material having a cubic rock salt structure as described in the first embodiment includes the step of preparing a first grain group containing at least either of aluminum grains and aluminum nitride grains, and at least one selected from the group consisting of chromium grains, titanium grains, silicon grains and grains of nitrides of these elements (indicated by S21 in FIG. 2, hereinafter, also referred to as "first grain group preparing step"); and the step of treating the first grain group by a static pressure synthetic method or a shock compression method to produce the hard material (indicated by S22 in FIG. 2, hereinafter, also referred to as "hard material producing step").

(First Grain Group Preparing Step)

Referring to FIG. 2, in the first grain group preparing step (S21), a first grain group containing at least either of aluminum grains and aluminum nitride grains, and at least one selected from the group consisting of chromium grains, titanium grains, silicon grains and grains of nitrides of these elements is prepared. Any of these grains preferably have an average grain size of less than or equal to 2 μm, and further preferably less than or equal to 1 μm. When the average grain size of hexagonal AlN grains, CrN grains, $Cr_2N$ grains, TiN grains, silicon grains and $Si_3N_4$ grains is less than or equal to 2 μm, it is possible to promote diffusion of AlN and $Cr_2N$, conversion of hexagonal $Cr_2N$ into cubic crystals and associated conversion of hexagonal AlN into cubic crystals, and conversion of AlCrN solid solution into cubic crystals in the hard material producing step as will be described below.

The first grain group is a material for a hard material. Among aluminum, nitrogen, titanium, chromium, and silicon that compose the hard material, aluminum, titanium, chromium, and silicon are supplied exclusively from the first grain group. Therefore, it is necessary to make the content rates of aluminum, titanium, chromium, and silicon in the first grain group the same as the content rates of aluminum, titanium, chromium, and silicon in the intended hard material. On the other hand, nitrogen in the hard material is supplied mainly from the atmosphere (nitrogen atmosphere). Therefore, the content rate of nitrogen in the first grain group is not necessarily required to be the same as the content rate of nitrogen in the hard material.

When the ratio among number of aluminum atoms "a", number of titanium atoms "b", number of chromium atoms "c", and number of silicon atoms "d" in the first grain group is represented by a:b:c:d (wherein a+b+c+d=1), "a" is preferably greater than or equal to 0.2 and less than or equal to 0.7, and more preferably greater than or equal to 0.5 and less than or equal to 0.7. When a falls within these ranges, it is possible to produce a hard material having high hardness. "b" is preferably greater than or equal to 0.2 and less than or equal to 0.7, and more preferably greater than or equal to 0.3 and less than or equal to 0.5. "c" is preferably greater than or equal to 0.2 and less than or equal to 0.7, and more preferably greater than or equal to 0.3 and less than or equal to 0.5. "d" is preferably greater than or equal to 0.1 and less than or equal to 0.5, and more preferably greater than or equal to 0.1 and less than or equal to 0.2.

The first grain group can further contain copper. The content of copper in the first grain group is preferably adjusted so that the content of copper in the hard material to be produced is greater than or equal to 0.1% by mass and less than or equal to 3.0% by mass, and more preferably greater than or equal to 0.1% by mass and less than or equal to 0.5% by mass.

The first grain group can further contain a first metal containing at least one selected from the group consisting of iron, cobalt and nickel. The total content of the first metal in the first grain group is preferably adjusted so that the total content of the first metal in the hard material to be produced is greater than or equal to 0.5% by mass and less than or equal to 5.0% by mass, and more preferably greater than or equal to 0.5% by mass and less than or equal to 1.0% by mass.

Copper and the first metal exert the effects of strengthening the hard material by the effects estimated as impartment of the residual stress caused by a difference in thermal expansion coefficient, Young's modulus difference, or solid solution in the subsequent hard material producing step. Therefore, when the target contains copper or the first metal, it is possible to produce a hard material having high hardness.

The first grain group can be obtained, for example, by ultrasonically dispersing hexagonal AlN grains, CrN grains, $Cr_2N$ grains, TiN grains, silicon grains and $Si_3N_4$ grains in an organic solvent such as ethanol, or grinding and mixing these grains with a bead mill, and drying the obtained slurry with a drier or the like.

(Hard Material Producing Step)

Next, in the hard material producing step (S22), the first grain group is treated by a static pressure synthetic method or a shock compression method to produce a hard material.

Conventionally, for obtaining cubic AlN, hexagonal AlN is subjected to a shock treatment under an ultra-high pressure condition of greater than or equal to 16 GPa, or hexagonal AlN made into aerosol is subjected to a shock treatment. However, with such a method, only part of hexagonal AlN is converted into cubic AlN.

The present inventors found that hexagonal AlN changes to cubic AlMN when at least either of aluminum grains and aluminum nitride grains, and at least one selected from the group consisting of chromium grains, titanium grains, silicon grains and grains of nitrides of these elements are mixed, and treated by a static pressure synthetic method or a shock compression method.

In the static pressure synthetic method, for example, the first grain group is treated in a nitrogen atmosphere at a pressure of greater than or equal to 10 kPa and less than or equal to 12 MPa and a temperature of greater than or equal to 600° C. and less than or equal to 3500° C. to obtain a hard material (cAlMN). The treatment conditions are more preferably a pressure of greater than or equal to 5 MPa and less than or equal to 10 MPa and a temperature of greater than or equal to 1200° C. and less than or equal to 3000° C. When the pressure is greater than or equal to 10 kPa, nitrogen is less likely to drop out during the reaction. When the temperature is greater than or equal to 600° C., interdiffusion between Al and M (M is at least one selected from the group consisting of titanium, chromium, and silicon) is promoted. As a synthetic method, a pressure furnace of hot isostatic pressurization (HIP) or the like, or a pressure combustion synthesis furnace can be used.

In the shock compression method, for example, the first grain group is mixed with a copper powder as a heatsink and a pressure medium, and the mixture is charged in a steel vessel, and pressurized instantaneously at a pressure of greater than or equal to 15 GPa by shock wave by an explosive or the like. Thus, a hard material (cubic AlMN) can be synthesized from the first grain group. The pressure of the shock pressurization is preferably greater than or equal to 15 GPa and less than or equal to 50 GPa, more preferably greater than or equal to 15 GPa and less than or equal to 30 GPa.

By dissolving and removing copper from the sample using an acid such as nitric acid after the treatment, it is possible to recover the intended hard material (cubic AlMN).

Preferably, the obtained hard material is ground to have an average grain size of greater than or equal to 0.1 μm and less than or equal to 10 μm with a ball mill device or a bead mill device. The hard material grains can be used as a material for a sintered material.

<Sixth Embodiment>

The method for manufacturing a sintered material according to the sixth embodiment will be described with reference to FIG. 3.

The method for manufacturing the sintered material as described in the second embodiment includes: the step of preparing a hard material by the manufacturing method as described in the fourth embodiment or the fifth embodiment (indicated by S31 in FIG. 3, hereinafter, also referred to as "hard material preparing step"), the step of preparing a second grain group containing the hard material (indicated by S32 in FIG. 3, hereinafter, also referred to as "second grain group preparing step"), and the step of sintering the second grain group to produce a sintered material (indicated by S33 in FIG. 3, hereinafter, also referred to as "sintered material producing step").

(Hard Material Preparing Step)

Figure 3:
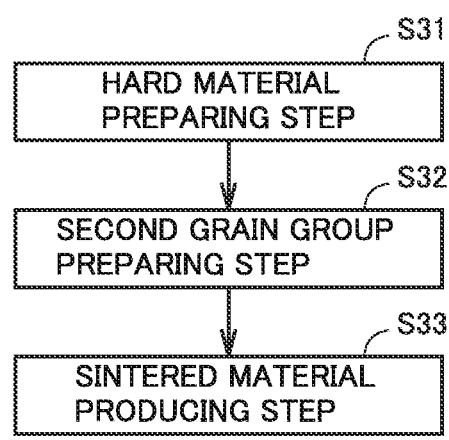
FIG. 3 is a flowchart illustrating a method for manufacturing a sintered material according to one aspect of the present invention.

Referring to FIG. 3, in the hard material preparing step (S31), a hard material is produced by using the method for manufacturing a hard material as described in the fourth embodiment or the fifth embodiment. Since the concrete method is the same as that of the fourth embodiment or the fifth embodiment, description thereof will not be repeated.

(Second Grain Group Preparing Step)

Next, a second grain group containing the hard material obtained in the hard material preparing step is prepared (S32).

The second grain group may contain only the hard material grains, or may contain a binder phase component together with the hard material grains.

As the binder phase component grains, grains of at least one compound formed of at least one transition metal element selected from the group consisting of elements in Group 4, elements in Group 5, and elements in Group 6 of the periodic table, and either one or both of carbon and nitrogen as described in the second embodiment can be used. Concrete examples of the compound are the same as those recited in the second embodiment, and thus description thereof will not be repeated.

Preferably, the second grain group contains greater than or equal to 30% by mass and less than or equal to 70% by mass of the binder phase component grains. In this case, the abrasion resistance of the sintered material obtained by sintering the second grain group is improved.

The second grain group preferably further contains greater than or equal to 10% by mass and less than or equal to 70% by mass, more preferably greater than or equal to 30% by mass and less than or equal to 50% by mass of cubic boron nitride. In this case, the abrasion resistance of the sintered material obtained by sintering the second grain group is improved.

When the second grain group contains binder phase component grains or cubic boron nitride, they are preferably mixed by using a ball mill or a jet mill. Preferably, the average grain size of the second grain group is greater than or equal to 0.1 μm and less than or equal to 10 μm.

(Sintered Material Producing Step)

The second grain group is treated at a pressure of greater than or equal to 10 kPa and less than or equal to 15 GPa, and a temperature of greater than or equal to 800° C. and less than or equal to 1900° C. to produce a sintered material. The sintered material producing step is preferably conducted in a nonoxidative atmosphere, and is particularly preferably conducted in vacuo or in a nitrogen atmosphere. While the sintering method is not particularly limited, spark plasma sintering (SPS), hot press, ultrahigh-pressure press and the like can be used.

EXAMPLE 1

The present invention will be described more specifically by way of examples.

It is to be noted that the present invention is not limited by these examples.

[Samples 1 to 58]

<Target Preparing Step>

A target was prepared so that the mixing ratio (atomic ratio) among Al, Ti, Cr, and Si in the target was equal to the ratio as described in the column "mixing ratio (atomic ratio) in target" of Table 1. When the target contained Cu, Fe, Co, and Ni, the target was prepared so that the mixing amounts (% by mass) of Cu, Fe, Co, and Ni in the target coincided with the mixing amounts as described in the column "mixing amount (% by mass) in target" of Table 1.

<Hard Material-containing Thin Film Synthesizing Step>

Next, the target was treated by an arc ion plating method to form a thin film on the high speed steel substrate. The treatment conditions were as follows: an Ar flow rate of 20 sccm, an $N_2$ flow rate of 80 sccm, a pressure of 2 Pa, a bias of 110 V, an arc current of 91 A, and a substrate temperature of 400° C. Next, the thin film formed on the high speed steel substrate was peeled off from the substrate, and ground with a bead mill to have a grain size of 0.5 μm to 3 μm to produce a slurry, and the slurry was dried to prepare hard material grains. The hard material grains were analyzed by XRD, and AlMN having a cubic rock salt structure was observed.

<Sintered Material Producing Step>

Next, the hard material grains were charged in a capsule made of tantalum, and sintered at a pressure of 5 GPa and a temperature of 1300° C. by using a press to obtain a sintered material.

<Measurement of Sintered Material> The sintered material was analyzed by XRD, and AlMN having a cubic rock salt structure was observed.

The sintered material was analyzed by ICP, and it was confirmed that the composition ratio of elements in the sintered material maintained the mixing ratio of elements in the target.

<Evaluation>

The obtained sintered material was cut by laser and finished, and a cutting tool having a tip nose R of 0.8 mm was produced. Using the obtained cutting tool, a cutting test of steel (S45C) was conducted in the following cutting conditions, and after 1 km cutting, the wear at flank face (μm) of each cutting tool was measured.

Cutting speed: 400 m/min.
Depth of cut: 0.2 mm
Feed rate: 0.1 mm/rev
Coolant: None The results are shown in Table 1.

[Sample 59]

As Sample 59, a cutting tool similar to Sample 1 was produced by using alumina ceramics (composition: $Al_2O_3$/$Y_2O_3$=95 vol %/5 vol %), and the cutting tool was evaluated similarly to the case of Sample 1. The results are shown in Table 1.

TABLE 1

| Sample No. | Mixing ratio (atomic ratio) in target | | | | Mixing amount (% by mass) in target | | | | Abrasion amount (μm) |
|---|---|---|---|---|---|---|---|---|---|
| | Al | Ti | Cr | Si | Cu | Fe | Co | Ni | |
| 1 | 0.3 | 0.7 | — | — | — | — | — | — | 52 |
| 2 | 0.5 | 0.5 | — | — | — | — | — | — | 48 |
| 3 | 0.7 | 0.3 | — | — | — | — | — | — | 45 |
| 4 | 0.3 | — | 0.7 | — | — | — | — | — | 55 |
| 5 | 0.5 | — | 0.5 | — | — | — | — | — | 50 |
| 6 | 0.7 | — | 0.3 | — | — | — | — | — | 46 |
| 7 | 0.5 | — | — | 0.5 | — | — | — | — | 52 |
| 8 | 0.7 | — | — | 0.3 | — | — | — | — | 48 |
| 9 | 0.5 | 0.3 | 0.2 | — | — | — | — | — | 49 |
| 10 | 0.5 | 0.2 | 0.3 | — | — | — | — | — | 50 |
| 11 | 0.5 | 0.3 | — | 0.2 | — | — | — | — | 49 |
| 12 | 0.5 | — | 0.3 | 0.2 | — | — | — | — | 51 |
| 13 | 0.5 | 0.2 | 0.2 | 0.1 | — | — | — | — | 51 |
| 14 | 0.5 | 0.5 | — | — | 0.1 | — | — | — | 42 |
| 15 | 0.5 | 0.5 | — | — | 0.5 | — | — | — | 40 |
| 16 | 0.5 | 0.5 | — | — | 3 | — | — | — | 45 |
| 17 | 0.5 | 0.5 | — | — | 5 | — | — | — | 50 |
| 18 | 0.5 | — | 0.5 | — | 0.1 | — | — | — | 43 |
| 19 | 0.5 | — | 0.5 | — | 0.5 | — | — | — | 41 |
| 20 | 0.5 | — | 0.5 | — | 3 | — | — | — | 45 |
| 21 | 0.5 | — | 0.5 | — | 5 | — | — | — | 50 |
| 22 | 0.5 | 0.3 | 0.2 | — | 0.5 | — | — | — | 42 |
| 23 | 0.5 | 0.3 | — | 0.2 | 0.5 | — | — | — | 42 |
| 24 | 0.5 | 0.2 | 0.2 | 0.1 | 0.5 | — | — | — | 44 |
| 25 | 0.5 | 0.5 | — | — | — | 0.5 | — | — | 43 |
| 26 | 0.5 | 0.5 | — | — | — | 1 | — | — | 41 |
| 27 | 0.5 | 0.5 | — | — | — | 5 | — | — | 44 |
| 28 | 0.5 | 0.5 | — | — | — | 10 | — | — | 52 |
| 29 | 0.5 | — | 0.5 | — | — | 0.5 | — | — | 45 |
| 30 | 0.5 | — | 0.5 | — | — | 1 | — | — | 42 |
| 31 | 0.5 | — | 0.5 | — | — | 5 | — | — | 44 |
| 32 | 0.5 | — | 0.5 | — | — | 10 | — | — | 54 |
| 33 | 0.5 | 0.3 | 0.2 | — | — | 1 | — | — | 43 |
| 34 | 0.5 | 0.3 | — | 0.2 | — | 1 | — | — | 44 |
| 35 | 0.5 | 0.2 | 0.2 | 0.1 | — | 1 | — | — | 44 |
| 36 | 0.5 | 0.5 | — | — | — | — | 1 | — | 42 |
| 37 | 0.5 | — | 0.5 | — | — | — | 1 | — | 43 |
| 38 | 0.5 | 0.3 | 0.2 | — | — | — | 1 | — | 43 |
| 39 | 0.5 | 0.3 | — | 0.2 | — | — | 1 | — | 44 |
| 40 | 0.5 | 0.2 | 0.2 | 0.1 | — | — | 1 | — | 45 |
| 41 | 0.5 | 0.5 | — | — | — | — | — | 1 | 43 |
| 42 | 0.5 | — | 0.5 | — | — | — | — | 1 | 43 |
| 43 | 0.5 | 0.3 | 0.2 | — | — | — | — | 1 | 43 |
| 44 | 0.5 | 0.3 | — | 0.2 | — | — | — | 1 | 44 |
| 45 | 0.5 | 0.2 | 0.2 | 0.1 | — | — | — | 1 | 45 |
| 46 | 0.5 | 0.5 | — | — | — | 0.5 | 0.5 | — | 42 |
| 47 | 0.5 | 0.5 | — | — | — | 0.3 | 0.3 | 0.3 | 43 |
| 48 | 0.5 | — | 0.5 | — | — | 0.5 | 0.5 | — | 43 |
| 49 | 0.5 | — | 0.5 | — | — | 0.3 | 0.3 | 0.3 | 44 |
| 50 | 0.5 | 0.2 | 0.2 | 0.1 | — | 0.3 | 0.3 | 0.3 | 45 |
| 51 | 0.5 | 0.5 | — | — | 0.5 | 1 | — | — | 40 |
| 52 | 0.5 | 0.5 | — | — | 0.5 | 0.5 | 0.5 | — | 41 |
| 53 | 0.5 | 0.5 | — | — | 0.5 | 0.3 | 0.3 | 0.3 | 41 |
| 54 | 0.5 | — | 0.5 | — | 0.5 | 1 | — | — | 41 |
| 55 | 0.5 | — | 0.5 | — | 0.5 | 0.5 | 0.5 | — | 40 |
| 56 | 0.5 | — | 0.5 | — | 0.5 | 0.3 | 0.3 | 0.3 | 41 |
| 57 | 0.5 | 0.2 | 0.2 | 0.1 | 0.5 | 1 | — | — | 42 |
| 58 | 0.5 | 0.2 | 0.2 | 0.1 | 0.5 | 0.3 | 0.3 | 0.3 | 43 |
| 59 | Alumina ceramics | | | | | | | | 160 |

<Evaluation Result>

Samples 1 to 58 were quite excellent in abrasion resistance compared with Sample 59.

EXAMPLE 2

[Samples 60 to 117]

<First Grain Group Preparing Step>

Hexagonal AlN grains, CrN grains, $Cr_2N$ grains, TiN grains, silicon grains and $Si_3N_4$ grains were mixed so that the mixing ratio (atomic ratio) among Al, Ti, Cr, and Si in the first grain group was equal to the ratio as described in the column "mixing ratio (atomic ratio) in first grain group" of Table 2. When the first grain group contains Cu, Fe, Co, and Ni, the first grain group was prepared so that the mixing amounts (% by mass) of Cu, Fe, Co, and Ni in the first grain group coincided with mixing amounts as described in the column "mixing amount (% by mass) in first grain group" of Table 2. The mixture was ground with a bead mill, and mixed to prepare a uniformly mixed slurry, and the slurry was dried to prepare the first grain group.

<Hard Material Producing Step>

Next, in a nitrogen furnace, the first grain group was treated at a nitrogen pressure of 8 MPa and a temperature of 2000° C. to produce a hard material (static pressure synthetic method). The hard material was analyzed by XRD, and AlMN having a cubic rock salt structure was observed.

<Sintered Material Producing Step>

Next, the hard material grains were charged in a capsule made of tantalum, and sintered at a pressure of 5 GPa and a temperature of 1300° C. by using a press to obtain a sintered material.

<Measurement of Sintered Material>

The sintered material was analyzed by XRD, and AlMN having a cubic rock salt structure was observed.

The sintered material was analyzed by ICP, and it was confirmed that the composition ratio of elements in the sintered material maintained the mixing ratio of elements in the first grain group.

<Evaluation>

Using the obtained sintered material, a cutting tool similar to Sample 1 was produced, and the cutting tool was evaluated similarly to the case of Sample 1. The results are shown in Table 2.

[Sample 118]

As Sample 118, a cutting tool similar to Sample 1 was produced by using alumina ceramics (composition: $Al_2O_3$/$Y_2O_3$=95 vol %/5 vol %), and the cutting tool was evaluated similarly to the case of Sample 1. The results are shown in Table 2.

TABLE 2

| Sample No. | Mixing ratio (atomic ratio) in first grain group | | | | Mixing amount (% by mass) in first grain group | | | | Abrasion amount (μm) |
|---|---|---|---|---|---|---|---|---|---|
| | Al | Ti | Cr | Si | Cu | Fe | Co | Ni | |
| 60 | 0.3 | 0.7 | — | — | — | — | — | — | 52 |
| 61 | 0.5 | 0.5 | — | — | — | — | — | — | 48 |
| 62 | 0.7 | 0.3 | — | — | — | — | — | — | 45 |
| 63 | 0.3 | — | 0.7 | — | — | — | — | — | 55 |
| 64 | 0.5 | — | 0.5 | — | — | — | — | — | 50 |
| 65 | 0.7 | — | 0.3 | — | — | — | — | — | 46 |
| 66 | 0.5 | — | — | 0.5 | — | — | — | — | 52 |
| 67 | 0.7 | — | — | 0.3 | — | — | — | — | 48 |
| 68 | 0.5 | 0.3 | 0.2 | — | — | — | — | — | 49 |
| 69 | 0.5 | 0.2 | 0.3 | — | — | — | — | — | 50 |
| 70 | 0.5 | 0.3 | — | 0.2 | — | — | — | — | 49 |
| 71 | 0.5 | — | 0.3 | 0.2 | — | — | — | — | 51 |
| 72 | 0.5 | 0.2 | 0.2 | 0.1 | — | — | — | — | 51 |
| 73 | 0.5 | 0.5 | — | — | 0.1 | — | — | — | 42 |
| 74 | 0.5 | 0.5 | — | — | 0.5 | — | — | — | 40 |
| 75 | 0.5 | 0.5 | — | — | 3 | — | — | — | 45 |
| 76 | 0.5 | 0.5 | — | — | 5 | — | — | — | 50 |
| 77 | 0.5 | — | 0.5 | — | 0.1 | — | — | — | 43 |
| 78 | 0.5 | — | 0.5 | — | 0.5 | — | — | — | 41 |
| 79 | 0.5 | — | 0.5 | — | 3 | — | — | — | 45 |
| 80 | 0.5 | — | 0.5 | — | 5 | — | — | — | 50 |
| 81 | 0.5 | 0.3 | 0.2 | — | 0.5 | — | — | — | 42 |
| 82 | 0.5 | 0.3 | — | 0.2 | 0.5 | — | — | — | 42 |
| 83 | 0.5 | 0.2 | 0.2 | 0.1 | 0.5 | — | — | — | 44 |
| 84 | 0.5 | 0.5 | — | — | — | 0.5 | — | — | 43 |
| 85 | 0.5 | 0.5 | — | — | — | 1 | — | — | 41 |
| 86 | 0.5 | 0.5 | — | — | — | 5 | — | — | 44 |
| 87 | 0.5 | 0.5 | — | — | — | 10 | — | — | 52 |
| 88 | 0.5 | — | 0.5 | — | — | 0.5 | — | — | 45 |
| 89 | 0.5 | — | 0.5 | — | — | 1 | — | — | 42 |
| 90 | 0.5 | — | 0.5 | — | — | 5 | — | — | 44 |
| 91 | 0.5 | — | 0.5 | — | — | 10 | — | — | 54 |
| 92 | 0.5 | 0.3 | 0.2 | — | — | 1 | — | — | 43 |
| 93 | 0.5 | 0.3 | — | 0.2 | — | 1 | — | — | 44 |
| 94 | 0.5 | 0.2 | 0.2 | 0.1 | — | 1 | — | — | 44 |
| 95 | 0.5 | 0.5 | — | — | — | — | 1 | — | 42 |
| 96 | 0.5 | — | 0.5 | — | — | — | 1 | — | 43 |
| 97 | 0.5 | 0.3 | 0.2 | — | — | — | 1 | — | 43 |
| 98 | 0.5 | 0.3 | — | 0.2 | — | — | 1 | — | 44 |
| 99 | 0.5 | 0.2 | 0.2 | 0.1 | — | — | 1 | — | 45 |
| 100 | 0.5 | 0.5 | — | — | — | — | — | 1 | 43 |
| 101 | 0.5 | — | 0.5 | — | — | — | — | 1 | 43 |
| 102 | 0.5 | 0.3 | 0.2 | — | — | — | — | 1 | 43 |
| 103 | 0.5 | 0.3 | — | 0.2 | — | — | — | 1 | 44 |
| 104 | 0.5 | 0.2 | 0.2 | 0.1 | — | — | — | 1 | 45 |
| 105 | 0.5 | 0.5 | — | — | — | 0.5 | 0.5 | — | 42 |
| 106 | 0.5 | 0.5 | — | — | — | 0.3 | 0.3 | 0.3 | 43 |
| 107 | 0.5 | — | 0.5 | — | — | 0.5 | 0.5 | — | 43 |
| 108 | 0.5 | — | 0.5 | — | — | 0.3 | 0.3 | 0.3 | 44 |
| 109 | 0.5 | 0.2 | 0.2 | 0.1 | — | 0.3 | 0.3 | 0.3 | 45 |
| 110 | 0.5 | 0.5 | — | — | 0.5 | 1 | — | — | 40 |
| 111 | 0.5 | 0.5 | — | — | 0.5 | 0.5 | 0.5 | — | 41 |
| 112 | 0.5 | 0.5 | — | — | 0.5 | 0.3 | 0.3 | 0.3 | 41 |
| 113 | 0.5 | — | 0.5 | — | 0.5 | 1 | — | — | 41 |
| 114 | 0.5 | — | 0.5 | — | 0.5 | 0.5 | 0.5 | — | 40 |
| 115 | 0.5 | — | 0.5 | — | 0.5 | 0.3 | 0.3 | 0.3 | 41 |
| 116 | 0.5 | 0.2 | 0.2 | 0.1 | 0.5 | 1 | — | — | 42 |
| 117 | 0.5 | 0.2 | 0.2 | 0.1 | 0.5 | 0.3 | 0.3 | 0.3 | 43 |
| 118 | Alumina ceramics | | | | | | | | 160 |

<Evaluation Result>

Samples 60 to 117 were quite excellent in abrasion resistance compared with Sample 118.

EXAMPLE 3

[Samples 119 to 121]

<First Grain Group Preparing Step>

Hexagonal AlN grains, CrN grains, $Cr_2N$ grains, TiN grains, silicon grains and $Si_3N_4$ grains were mixed so that the mixing ratio (atomic ratio) among Al, Ti, Cr, and Si in the first grain group was equal to the ratio as described in the column "mixing ratio (atomic ratio) in first grain group" of Table 3. The mixture was ground with a bead mill, and mixed to prepare a uniformly mixed slurry, and the slurry was dried to prepare the first grain group.

<Hard Material Producing Step>

Next, the first grain group was mixed with a heatsink and a copper powder, and charged in a steel vessel. Then, by explosion of an explosive, the first grain group was treated at a pressure of 15 to 30 GPa to produce a hard material (shock compression method). The hard material was analyzed by XRD, and AlMN having a cubic rock salt structure was observed.

<Sintered Material Producing Step>

Next, the hard material grains were charged in a capsule made of tantalum, and sintered at a pressure of 5 GPa and a temperature of 1300° C. by using a press to obtain a sintered material.

<Measurement of Sintered Material>

The sintered material was analyzed by XRD, and AlMN having a cubic rock salt structure was observed.

The sintered material was analyzed by ICP, and it was confirmed that the composition ratio of Al, Ti, Cr, and Si in the sintered material maintained the mixing ratio of Al, Ti, Cr, and Si in the first grain group. In the sintered material, Cu and Fe were also observed. These elements would have been derived from the copper powder and the steel vessel used in the hard material producing step.

<Evaluation>

Using the obtained sintered material, a cutting tool similar to Sample 1 was produced, and the cutting tool was evaluated similarly to the case of Sample 1. The results are shown in Table 3.

TABLE 3

| Sample No. | Mixing ratio (atomic ratio) in first grain group | | | | ICP measurement result (% by mass) of sintered material | | | | Abrasion amount (μm) |
|---|---|---|---|---|---|---|---|---|---|
| | Al | Ti | Cr | Si | Cu | Fe | Co | Ni | |
| 119 | 0.5 | 0.5 | — | — | 0.5 | 1 | — | — | 40 |
| 120 | 0.5 | — | 0.5 | — | 0.5 | 1 | — | — | 41 |
| 121 | 0.5 | 0.2 | 0.2 | 0.1 | 0.5 | 1 | — | — | 42 |

Samples 119 to 121 were quite excellent in abrasion resistance.

EXAMPLE 4

[Samples 122 to 155]
<Hard Material Preparing Step>

As a hard material, the hard material made of Sample 2, Sample 5, Sample 15, Sample 26, Sample 51 or Sample 57 was prepared.

<Second Grain Group Preparing Step>

The hard material grains, binder phase component grains and cubic boron nitride were mixed in the ratio shown in Table 4 to prepare a second grain group.

<Sintered Material Producing Step>

The second grain group was charged in a capsule made of tantalum, and sintered at a pressure of 5 GPa and a temperature of 1300° C. by using a press to obtain a sintered material.

<Measurement of Sintered Material>

The sintered material was analyzed by XRD, and AlMN having a cubic rock salt structure was observed.

The sintered material was analyzed by ICP, and it was confirmed that the composition ratio of elements in the sintered material maintained the mixing ratio of elements in the second grain group.

<Evaluation>

Using the obtained sintered material, a cutting tool similar to Sample 1 was produced, and the cutting tool was evaluated similarly to the case of Sample 1. The results are shown in Table 4.

TABLE 4

| | | Second grain group | | | |
|---|---|---|---|---|---|
| | Hard material grain | Binder phase component grain | | Cubic boron nitride | |
| Sample No. | Hard material sample No. | Mixing amount (% by mass) | Kind | Mixing amount (% by mass) | Mixing amount (% by mass) | Abrasion amount (μm) |
| 122 | 2 | 70 | TiN | 30 | 0 | 45 |
| 123 | 2 | 50 | TiN | 50 | 0 | 44 |

TABLE 4-continued

| | | Second grain group | | | |
|---|---|---|---|---|---|
| | Hard material grain | Binder phase component grain | | Cubic boron nitride | |
| Sample No. | Hard material sample No. | Mixing amount (% by mass) | Kind | Mixing amount (% by mass) | Mixing amount (% by mass) | Abrasion amount (μm) |
| 124 | 2 | 30 | TiN | 70 | 0 | 46 |
| 125 | 5 | 50 | TiN | 50 | 0 | 45 |
| 126 | 15 | 50 | TiN | 50 | 0 | 36 |
| 127 | 26 | 50 | TiN | 50 | 0 | 47 |
| 128 | 51 | 50 | TiN | 50 | 0 | 36 |
| 129 | 57 | 50 | TiN | 50 | 0 | 48 |
| 130 | 2 | 50 | TiC | 50 | 0 | 45 |
| 131 | 2 | 50 | CrN | 50 | 0 | 45 |
| 132 | 2 | 50 | ZrN | 50 | 0 | 46 |
| 133 | 2 | 50 | TaN | 50 | 0 | 46 |
| 134 | 2 | 50 | HfN | 50 | 0 | 46 |
| 135 | 2 | 50 | ZrC | 50 | 0 | 45 |
| 136 | 2 | 50 | TaC | 50 | 0 | 45 |
| 137 | 2 | 50 | HfC | 50 | 0 | 46 |
| 138 | 2 | 50 | TiN ZrN | 25 25 | 0 | 46 |
| 139 | 2 | 50 | TiC HfN | 25 25 | 0 | 45 |
| 140 | 2 | 50 | TiC ZrC | 25 25 | 0 | 45 |
| 141 | 2 | 45 | TiN | 45 | 10 | 42 |
| 142 | 2 | 35 | TiN | 35 | 30 | 41 |
| 143 | 2 | 25 | TiN | 25 | 50 | 41 |
| 144 | 2 | 15 | TiN | 15 | 70 | 48 |
| 145 | 2 | 5 | TiN | 5 | 90 | 55 |
| 146 | 5 | 35 | TiN | 35 | 30 | 43 |
| 147 | 15 | 35 | TiN | 35 | 30 | 38 |
| 148 | 26 | 35 | TiN | 35 | 30 | 38 |
| 149 | 51 | 35 | TiN | 35 | 30 | 39 |
| 150 | 57 | 35 | TiN | 35 | 30 | 39 |
| 151 | 2 | 35 | TiC | 35 | 30 | 42 |
| 152 | 2 | 35 | TiCN | 35 | 30 | 42 |
| 153 | 2 | 35 | TiN ZrN | 17 18 | 30 | 43 |
| 154 | 2 | 35 | TiC HfN | 17 18 | 30 | 43 |
| 155 | 2 | 35 | TiC ZrC | 17 18 | 30 | 43 |

Samples 122 to 155 were quite excellent in abrasion resistance. It is to be understood that the embodiments and examples disclosed herein are illustrative, and are not limitative in every point. The scope of the present invention is specified by claims rather than by the aforementioned embodiments, and any modification within the equivalent meaning and the scope of claims are intended to be included in the present invention.

INDUSTRIAL APPLICABILITY

The sintered material containing cubic sialon according to one embodiment of the present invention can be widely used for a cutting tool. It can be used, for example, for drills, end mills, indexable cutting tips for milling, indexable cutting tips for turning, metal saws, gear cutting tools, reamers, and taps.

The invention claimed is:
1. A hard material comprising:
   aluminum;
   nitrogen; and
   at least one selected from the group consisting of titanium, chromium, and silicon, and
   having a cubic rock salt structure, wherein said hard material contains greater than or equal to 0.1% by mass and less than or equal to 3.0% by mass of copper and said hard material contains a total of greater than or equal to 0.5% by mass and less than or equal to 5.0% by mass of a first metal containing at least one selected from the group consisting of iron, cobalt and nickel.

2. A sintered material comprising the hard material according to claim 1.

3. The sintered material according to claim 2, further comprising at least one compound formed of at least one transition metal element selected from the group consisting of elements in Group 4, elements in Group 5, and elements in Group 6 of the periodic table, and either one or both of carbon and nitrogen.

4. The sintered material according to claim 2, further comprising greater than or equal to 10% by mass and less than or equal to 70% by mass of cubic boron nitride.

5. A cutting tool comprising the sintered material according to claim 2.

6. A method for manufacturing the hard material according to claim 1, comprising the steps of:
preparing a target containing
aluminum,
at least one selected from the group consisting of titanium, chromium, and silicon,
at least one selected from the group consisting of iron, cobalt and nickel and
copper as constituent elements; and
treating said target in an argon and nitrogen atmosphere by a physical vapor deposition method to gas-phase synthesize a thin film containing said hard material on a substrate.

7. A method for manufacturing the hard material according to claim 1, comprising the steps of:
preparing a first grain group containing
at least either of aluminum grains and aluminum nitride grains,
at least one selected from the group consisting of chromium grains, titanium grains, silicon grains and grains of nitrides of these elements,
at least one selected from the group consisting of iron, cobalt and nickel, and
copper; and
treating said first grain group by a static pressure synthetic method or a shock compression method to produce said hard material.

8. A method for manufacturing the sintered material according to claim 2, comprising the steps of:
preparing a hard material;
preparing a second grain group containing said hard material; and
sintering said second grain group to produce a sintered material, wherein
the step of preparing said hard material includes a step of preparing a target containing
aluminum,
at least one selected from the group consisting of titanium, chromium, and silicon,
at least one selected from the group consisting of iron, cobalt and nickel, and
copper as constituent elements, and
a step of treating said target in an argon and nitrogen atmosphere by a physical vapor deposition method to gas-phase synthesize a thin film containing said hard material on a substrate.

9. A method for manufacturing the sintered material according to claim 2, comprising the steps of:
preparing a hard material;
preparing a second grain group containing said hard material; and
sintering said second grain group to produce a sintered material, wherein
the step of preparing said hard material includes a step of preparing a first grain group containing
at least either of aluminum grains and aluminum nitride grains,
at least one selected from the group consisting of chromium grains, titanium grains,
silicon grains and grains of nitrides of these elements,
at least one selected from the group consisting of iron, cobalt and nickel, and copper.

* * * * *